(12) United States Patent
Liang

(10) Patent No.: US 9,403,631 B2
(45) Date of Patent: Aug. 2, 2016

(54) WATERPROOF HERMETICALLY-SEALED ELECTRONIC PRODUCT PROTECTION DEVICE

(71) Applicant: Hui-Hu Liang, Sioushuei Township, Changhua County (TW)

(72) Inventor: Hui-Hu Liang, Sioushuei Township, Changhua County (TW)

( * ) Notice: Subject to any disclaimer, the term of this patent is extended or adjusted under 35 U.S.C. 154(b) by 34 days.

(21) Appl. No.: 13/804,520

(22) Filed: Mar. 14, 2013

(65) Prior Publication Data

US 2014/0216952 A1 Aug. 7, 2014

(30) Foreign Application Priority Data

Feb. 6, 2013 (TW) .............................. 102104620 A

(51) Int. Cl.
| | |
|---|---|
| *B65D 81/18* | (2006.01) |
| *H04M 1/18* | (2006.01) |
| *H05K 5/06* | (2006.01) |
| *G06F 1/16* | (2006.01) |
| *H04B 1/3888* | (2015.01) |
| *H04B 1/38* | (2015.01) |

(52) U.S. Cl.
CPC .............. *B65D 81/18* (2013.01); *G06F 1/1626* (2013.01); *H04B 1/3888* (2013.01); *H04M 1/18* (2013.01); *H05K 5/063* (2013.01); *G06F 2200/1633* (2013.01); *H04B 2001/3894* (2013.01)

(58) Field of Classification Search
CPC .................... A45C 2011/002; A45C 2011/003
USPC ............... 206/320, 38, 1.5; 455/575.1, 575.8; 220/232–234, 795, 378
See application file for complete search history.

(56) References Cited

U.S. PATENT DOCUMENTS

| | | | |
|---|---|---|---|
| 7,436,653 B2* | 10/2008 | Yang ................... | H04M 1/0202 361/679.01 |
| 7,594,576 B2* | 9/2009 | Chen et al. ..................... | 206/320 |
| 7,941,196 B2* | 5/2011 | Kawasaki ............ | H04B 1/3888 379/428.01 |
| 8,716,598 B2* | 5/2014 | Pan ................................. | 174/50 |
| 2005/0130721 A1* | 6/2005 | Gartrell ............... | H04M 1/0283 455/575.8 |
| 2012/0314354 A1 | 12/2012 | Rayner | |
| 2014/0206420 A1* | 7/2014 | Neichi ....................... | 455/575.8 |

FOREIGN PATENT DOCUMENTS

| | | |
|---|---|---|
| JP | 3-650 A | 1/1991 |
| JP | 2000-043840 A | 2/2000 |
| JP | 2011-176199 | 9/2011 |

(Continued)

*Primary Examiner* — Anthony Stashick
*Assistant Examiner* — Robert Poon
(74) *Attorney, Agent, or Firm* — Muncy, Geissler, Olds & Lowe, P.C.

(57) ABSTRACT

A waterproof hermetically-sealed electronic product protection device includes a body and at least a covering element. The body has a receiving space and at least an opening in communication with the receiving space. The body has a positioning section at the periphery of the at least an opening. The at least a covering element has a protective portion and an engaging portion circumferentially disposed at the periphery of the protective portion. The engaging portion is engaged with the positioning section of the body, such that the at least a covering element covers the at least an opening, and the receiving space is airtight. Hence, not only is the engaging portion engaged with and fixed to the positioning section, but the receiving space is also waterproof and airtight to thereby provide electronic product protection and enable users to operate an electronic product with the protective portion directly.

12 Claims, 9 Drawing Sheets

(56) References Cited

FOREIGN PATENT DOCUMENTS

| JP | 2012-256720 A | 12/2012 |
| WO | WO 2008/133276 A1 | 6/2008 |
| WO | WO 2012/051358 A2 | 4/2012 |
| WO | WO 2013027554 A1 * | 2/2013 |

* cited by examiner

WATERPROOF HERMETICALLY-SEALED ELECTRONIC PRODUCT PROTECTION DEVICE

BACKGROUND OF THE INVENTION

1. Field of the Invention

The present invention relates to electronic product protection devices, and more particularly, to a waterproof hermetically-sealed electronic product protection device.

2. Description of Related Art

With electronic products, such as smartphones and tablets, being in wide use increasingly, protection and maintenance of the electronic products is becoming more important. If users smudge or spill water on smartphones inadvertently, the smartphones will be smudged or wetted superficially, or will even have a short circuit-induced failure because of the intrusion of water or dirt into the smartphones.

Various commercially available smartphone protective cases are made of plastics and adapted to contain and protect smartphones. The users have the smartphones accommodated inside protective cases and hold the protective cases while using and operating the smartphones.

However, the conventional protective cases can do nothing but enclose the smartphone. Furthermore, the conventional protective cases are not only bulky and heavy, but neither waterproof nor airtight. Although the conventional protective cases are equipped with rubber cushion rings, the manufacturing process of the rubber cushion rings is intricate, not to mention that the rubber cushion rings even lack a usual waterproof feature.

SUMMARY OF THE INVENTION

It is an objective of the present invention to provide an electronic product protection device for enclosing an electronic product completely to thereby enhance the waterproof feature and effectuate a hermetic seal of the electronic product.

In order to achieve the above and other objectives, the present invention provides a waterproof hermetically-sealed electronic product protection device, comprising a body and at least a covering element. The body has therein a receiving space and at least an opening in communication with the receiving space. A positioning section is disposed at the periphery of the at least an opening of the body. The covering element has a protective portion and an engaging portion disposed circumferentially at the periphery of the protective portion. The engaging portion is embedded in the positioning section of the body, such that the covering element covers the at least an opening of the body, and the receiving space of the body is hermetically sealed. Hence, not only is the engaging portion engaged with the positioning section, but the covering element is also fixed to the at least an opening of the body. Furthermore, the receiving space of the body is waterproof and hermetically sealed to thereby protect an electronic product and allow the electronic product to be directly operated by means of the protective portion.

The detailed structures, features, and technical contents of the present invention are hereunder described and illustrated with specific embodiments. However, persons skilled in the art understand that the description and the embodiments are illustrative of the present invention rather than restrictive of the claims of the present invention.

DETAILED DESCRIPTION OF THE EMBODIMENTS OF THE INVENTION

Figure 1:
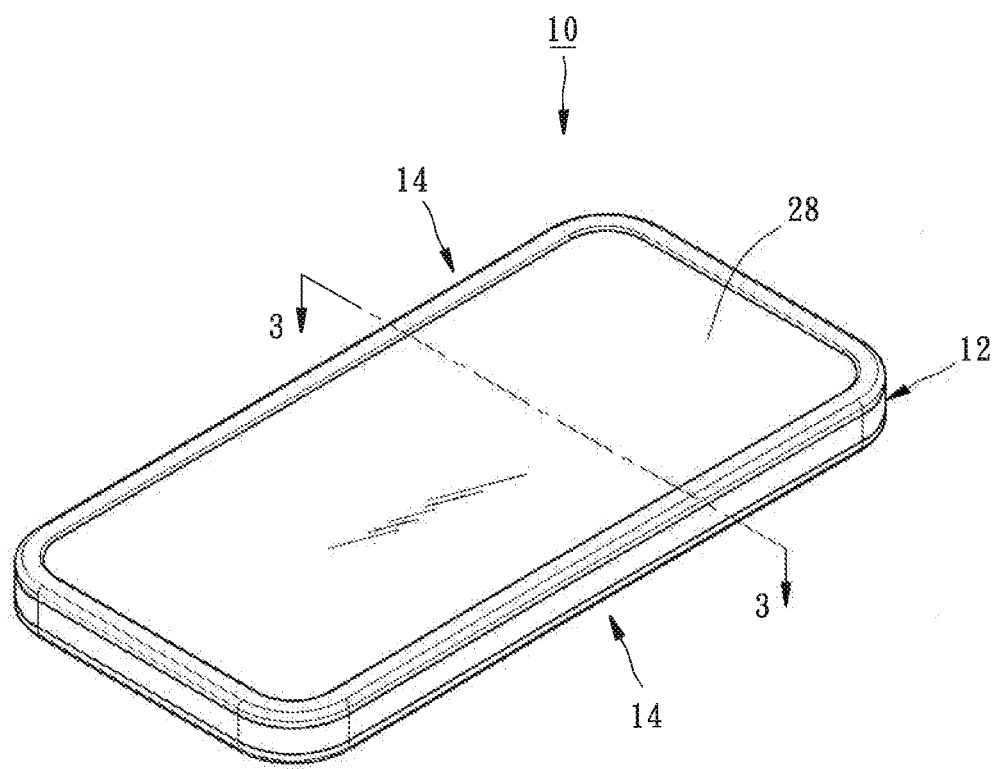
FIG. 1 is a perspective view of a waterproof hermetically-sealed electronic product protection device according to the first preferred embodiment of the present invention.
Figure 2:
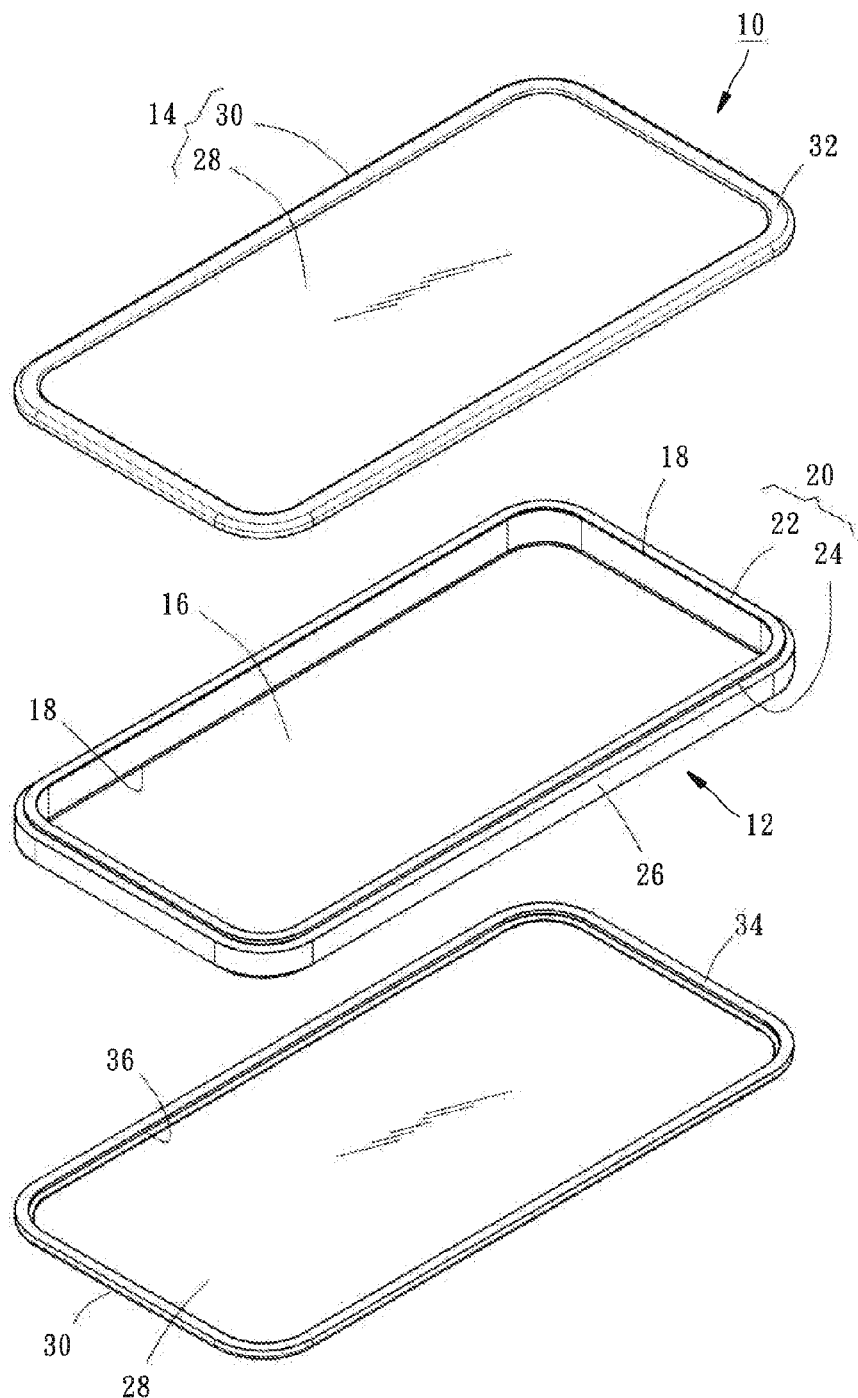
FIG. 2 is an exploded view of the waterproof hermetically-sealed electronic product protection device according to the first preferred embodiment of the present invention.

The technical contents and features of the present invention are hereunder illustrated with several preferred embodiment in conjunction with drawings. Referring to FIG. 1 and FIG. 2, the present invention provides a waterproof hermetically-sealed electronic product protection device 10 comprising a body 12 and at least a covering element 14. In the first preferred embodiment of the present invention, the at least a covering element 14 are in the number of two. The body 12 is shaped like a rectangular frame with rounded corners, and has therein a receiving space 16 and two openings 18 in communication with the receiving space 16. Two positioning sections 20 surrounding the openings 18 are disposed at the top and the bottom of the body 12, respectively. The positioning sections 20 each have a loop-shaped hooking portion 22 and a groove 24. The grooves 24 adjoin the hooking portions 22, respectively, and are each disposed concavely on a lateral surface 26 of the body 12.

Figure 3:
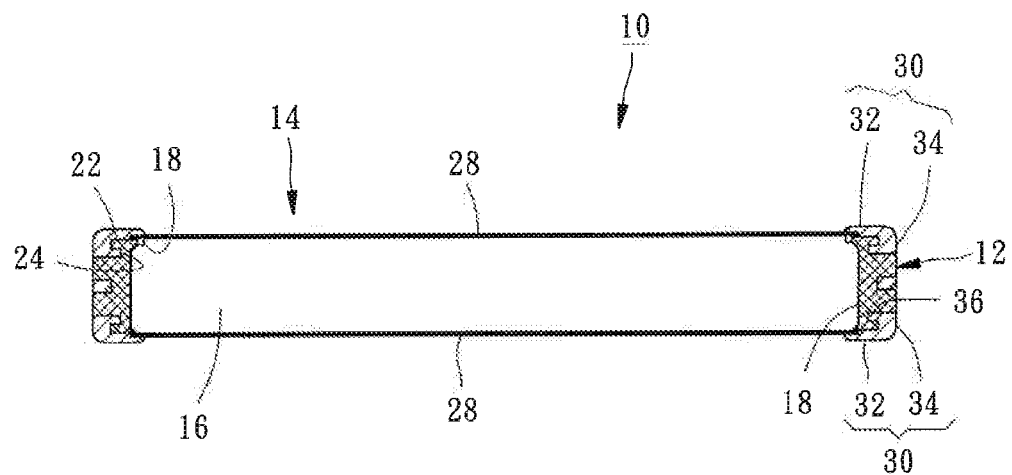
FIG. 3 is a cross-sectional view of the waterproof hermetically-sealed electronic product protection device taken along line 3-3 of FIG. 1 according to the first preferred embodiment of the present invention.

The covering elements 14 each have a protective portion 28. In this preferred embodiment, the protective portion 28 is a transparent abrasion resistant sheet for use with a touch panel. An engaging portion 30 is disposed at the periphery of the protective portion 28, as shown in FIG. 2 and FIG. 3. The engaging portion 30 is made of a soft material, such as rubber or silicone. The engaging portion 30 has a loop-shaped first extension section 32 and a second extension section 34 that adjoins the first extension section 32. A protruding wall 36 is disposed at an end portion of the second extension section 34. The two covering elements 14 are disposed at the openings 18 of the body 12, respectively. The first extension section 32 and the second extension section 34 extend along the periphery of the hooking portions 22, such that the protruding wall 36 is embedded in the groove 24 and fixed thereto to thereby allow the protective portion 28 to cover the openings 18 of the body 12. The engaging portion 30 is disposed circumferentially at the periphery of the openings 18 by extending along the positioning section 20 of the body 12.

Figure 5:
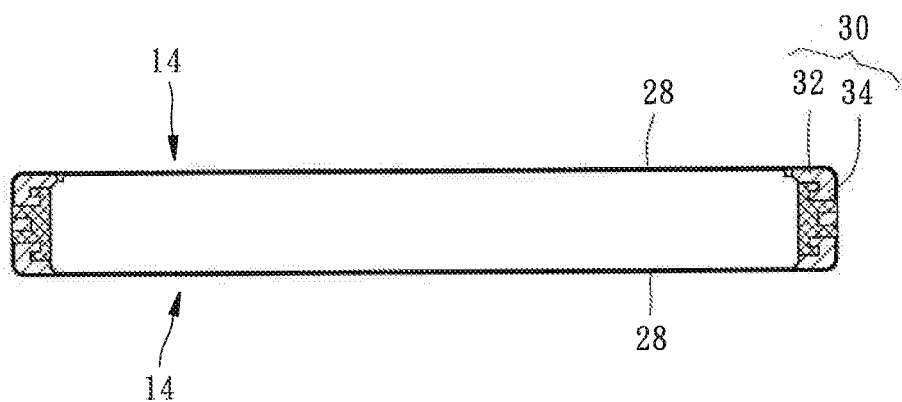
FIG. 5 is a cross-sectional diagram similar to FIG. 3 according to the first preferred embodiment of the present invention.
Figure 6:
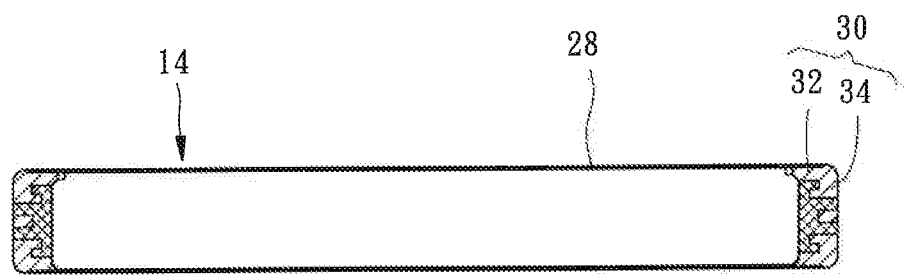
FIG. 6 is a cross-sectional diagram similar to FIG. 3 according to the first preferred embodiment of the present invention.

Referring to FIG. 3, the protective portion 28 and the engaging portion 30 of each of the covering elements 14 are coupled together by means of adhesion and/or injection, such that the top surface of the first extension section 32 is higher than the top surface of the protective portion 28. Referring to FIG. 5, the protective portion 28 and the engaging portion 30 are coupled together by means of in-mold injection molding, such that not only is the top surface of the first extension section 32 flush with the top surface of the protective portion 28, but the periphery of the protective portion 28 also extends to and encloses the engaging portion 30, or is merely disposed at the first extension section 32 in a manner illustrated with FIG. 6.

Given the aforesaid constituent components, in order for a waterproof hermetically-sealed electronic product protection device of the present invention to apply to a smartphone, it is necessary to put the smartphone in the receiving space 16 of the body 12, and position the two covering elements 14 at the two openings 18, respectively, to thereby allow the first extension section 32 and the second extension section 34 to be engaged with the positioning section 20 due to material-based resilience of the engaging portion 30, allow the covering elements 14 to be fixed to the openings 18 of the body 12, respectively, render the receiving space 16 of the body 12 waterproof and hermetically-sealed to thereby protect the smartphone, and enable a user to operate the touch panel of the smartphone directly by means of the protective portion 28. Depending on the configuration of the smartphone, the body 12 is equipped with at least a slot and a button corresponding in position thereto, such that operation and use of the smartphone can be accomplished directly by means of the waterproof hermetically-sealed electronic product protection device of the present invention.

Figure 4:
FIG. 4 is a cross-sectional diagram similar to FIG. 3 according to the first preferred embodiment of the present invention.

The present invention is characterized in that not only are the openings 18 of the body 12 covered with the covering elements 14, but the engaging portion 30 of the covering elements 14 also extends directly to the vicinity of the protective portion 28 to thereby allow the body 12 to be hermetically sealed with the engaging portion 30; hence, the covering elements 14 are thin in their entirety, and thus the waterproof hermetically-sealed electronic product protection device of the present invention can be made compact. Another advantage of the waterproof hermetically-sealed electronic product protection device of the present invention is that it is waterproof and hermetically-sealed. Yet another advantage of the waterproof hermetically-sealed electronic product protection device of the present invention is that its constituent components are structurally simple, and it features ease of use. A further advantage of the waterproof hermetically-sealed electronic product protection device of the present invention is that the manufacturing process of the protective portion 28 and the engaging portion 30 of each of the covering elements 14 is subject to changes as needed, and thus the manufacturing cost of the waterproof hermetically-sealed electronic product protection device of the present invention is relatively low. The waterproof hermetically-sealed electronic product protection device of the present invention is also characterized in that not only is the body 12 equipped with the two openings 18, but the body 12 can also be unilaterally equipped with one said opening 18 as shown in FIG. 4, not to mention that the covering elements 14 are disposed at the openings 18, respectively, to achieve the advantages of the present invention.

Figure 7:
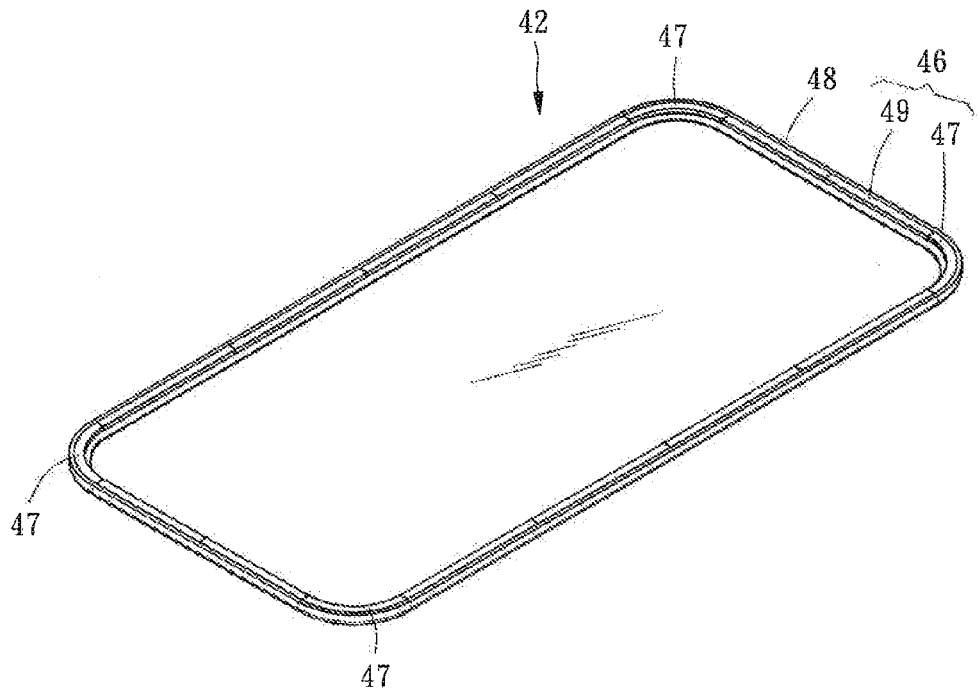
FIG. 7 is a perspective view of covering element of the waterproof hermetically-sealed electronic product protection device according to the second preferred embodiment of the present invention.
Figure 8:
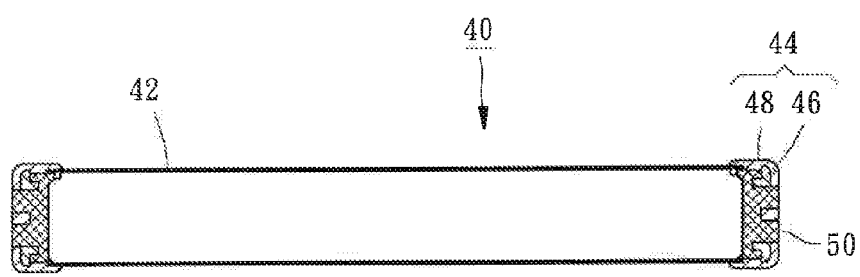
FIG. 8 is similar to FIG. 3 and is a cross-sectional view of the waterproof hermetically-sealed electronic product protection device according to the second preferred embodiment of the present invention.

Referring to FIG. 7 and FIG. 8, to render it easy to use and operate, a waterproof hermetically-sealed electronic product protection device 40 according to the second preferred embodiment of the present invention is characterized in that the second extension section 46 of an engaging portion 44 of a covering element 42 is loop-shaped and extends to thereby be fixed to the inner surface of the first extension section 48. The second extension section 46 is defined with hard areas 47 and soft areas 49 spaced apart therefrom. The hard areas 47 are made of a material of higher rigidity than that of the soft areas 49. The first extension section 48 and the second extension section 46 of the engaging portion 44 are made by bi-injection molding. Hence, the higher degree of hardness in the hard areas 47 of the second extension section 46 reinforces the engaging portion 44, especially the corner-sited part thereof, such that the engaging portion 44 and a body 50 are coupled together and fixed to each other.

Figure 9:
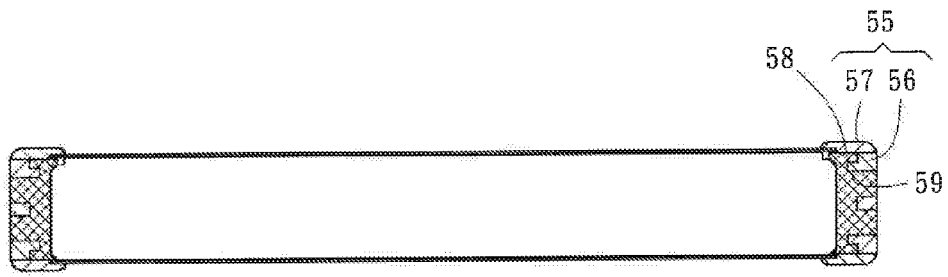
FIG. 9 is similar to FIG. 8 and is a cross-sectional view of a covering element of the waterproof hermetically-sealed electronic product protection device according to the second preferred embodiment of the present invention.

In the aforesaid preferred embodiments, an engaging portion is fixed to a hooking portion of a body to effectuate a hermetic seal thereto. However, it is also feasible for the engaging portion to be replaced with an equivalent structure in order to bring about the aforesaid effect. Referring to FIG. 9, the second extension section 56 of an engaging portion 55 is superimposed on the bottom surface of a loop-shaped first extension section 57, whereas the edge of the second extension section 56 is flush with the edge of the first extension section 57. The first extension section 57 and the second extension section 56 are disposed at a hooking portion 58 to selectively allow the first extension section 57 to abut against the top surface of the hooking portion 58 or allow the second extension section 56 to abut against the inner wall surface of a groove 59 and thereby bring about a hermetic seal thereto.

Figure 10:
FIG. 10 is similar to FIG. 8 and is a cross-sectional view of a covering element of the waterproof hermetically-sealed electronic product protection device according to the second preferred embodiment of the present invention.

Referring to FIG. 10, the first extension section 57 of the engaging portion 55 is engaged with the hooking portion 58 directly, whereas the second extension section 56 encloses the outer edge of the first extension section 57. The second extension section 56 is made of a material of higher rigidity than that of the first extension section 57 to thereby effectuate structural reinforcement and a hermetic seal.

Figure 11:
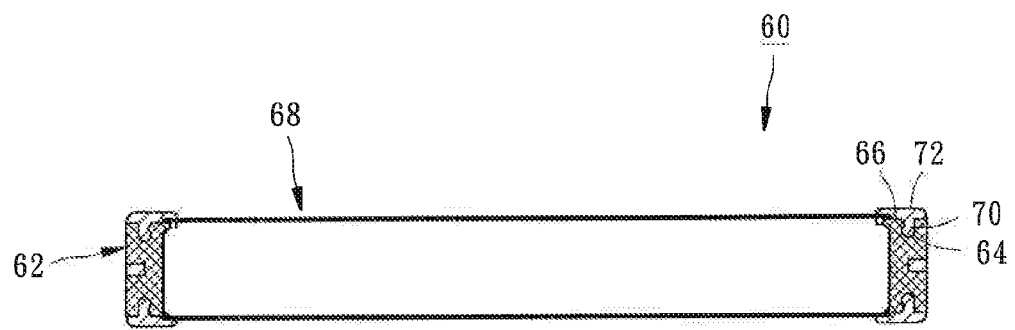
FIG. 11 is similar to FIG. 10 and is a cross-sectional view of the waterproof hermetically-sealed electronic product protection device according to the third preferred embodiment of the present invention.
Figure 12:
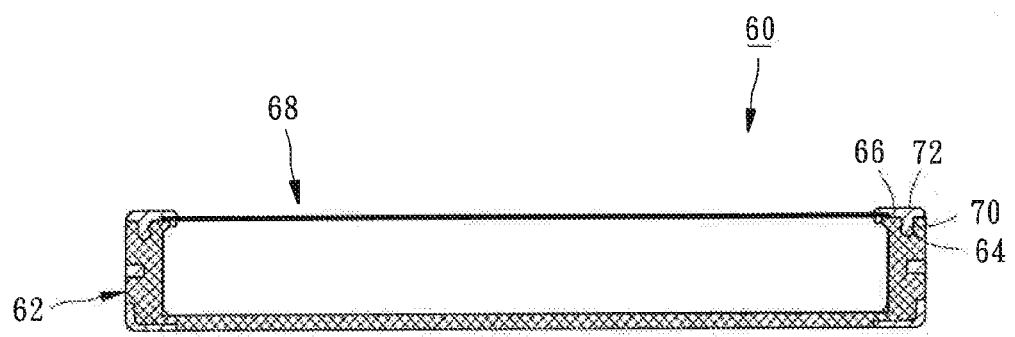
FIG. 12 is similar to FIG. 11 and is a cross-sectional view of the waterproof hermetically-sealed electronic product protection device according to the third preferred embodiment of the present invention.
Figure 13:
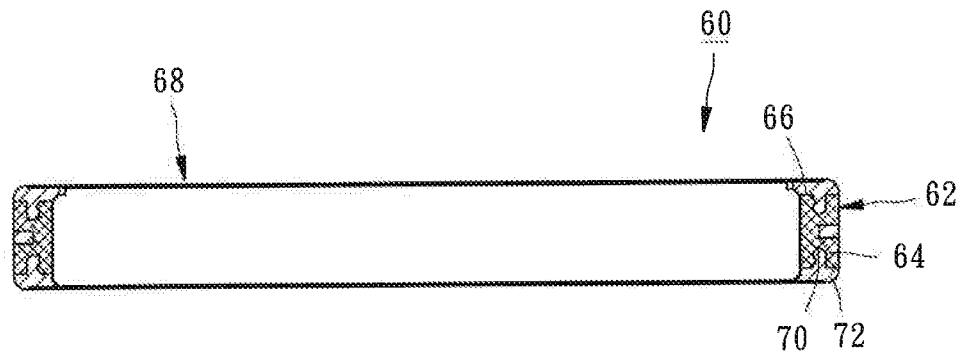
FIG. 13 is similar to FIG. 11 and is a cross-sectional view of the waterproof hermetically-sealed electronic product protection device according to the third preferred embodiment of the present invention.
Figure 14:
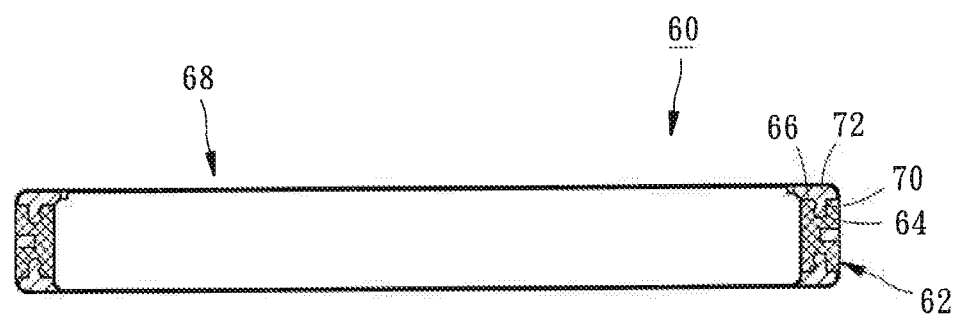
FIG. 14 is similar to FIG. 11 and is a cross-sectional view of the waterproof hermetically-sealed electronic product protection device according to the third preferred embodiment of the present invention.

There is an alternative way of coupling together a covering element and a body of the present invention. Referring to FIG. 11, in the third preferred embodiment of the present invention, a waterproof hermetically-sealed electronic product protection device 60 is characterized in that: a groove 64 of a body 62 is disposed concavely on a top surface 66 directly; a second extension section 70 of a covering element 68 protrudes directly from an inner surface of a first extension section 72; and the cross-sectional surface of the second extension section 70 protrudes and is fixed to the groove 64, such that the covering element 68 and the body 62 are fixed to each other. Referring to FIG. 12 through FIG. 14, a protective portion 74 and an engaging portion 76 of the covering element 68 are coupled together by means of adhesion or in-mold injection.

Figure 15:
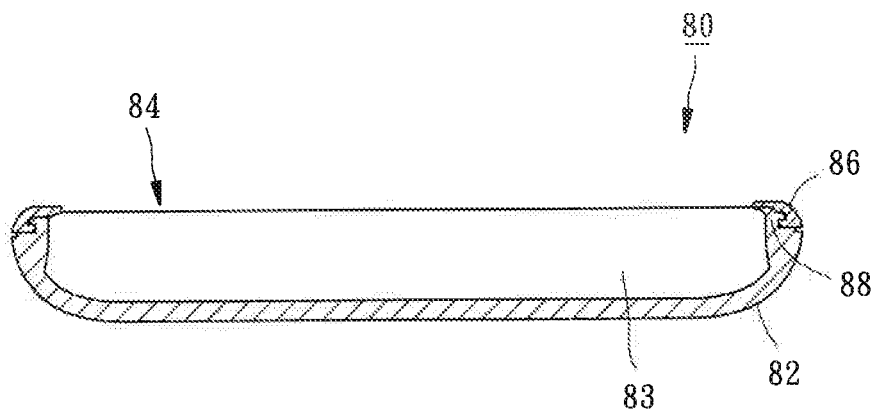
FIG. 15 is similar to FIG. 14 and is a cross-sectional view of the waterproof hermetically-sealed electronic product protection device according to the fourth preferred embodiment of the present invention.
Figure 16:
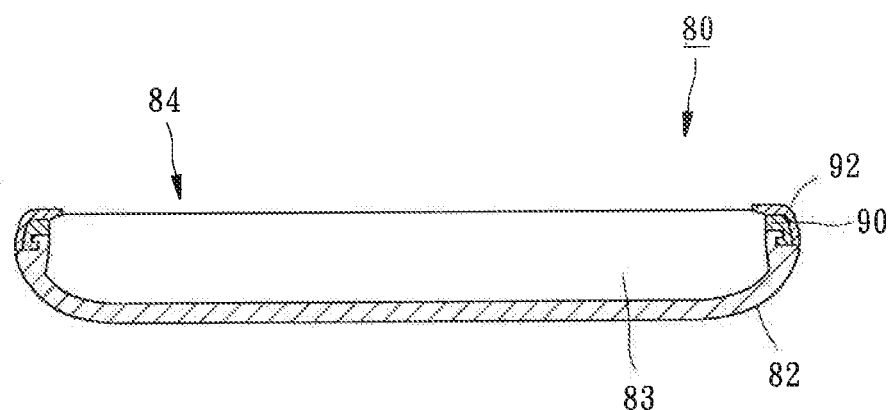
FIG. 16 is similar to FIG. 15 and is a cross-sectional view of the waterproof hermetically-sealed electronic product protection device according to the fourth preferred embodiment of the present invention.
Figure 17:
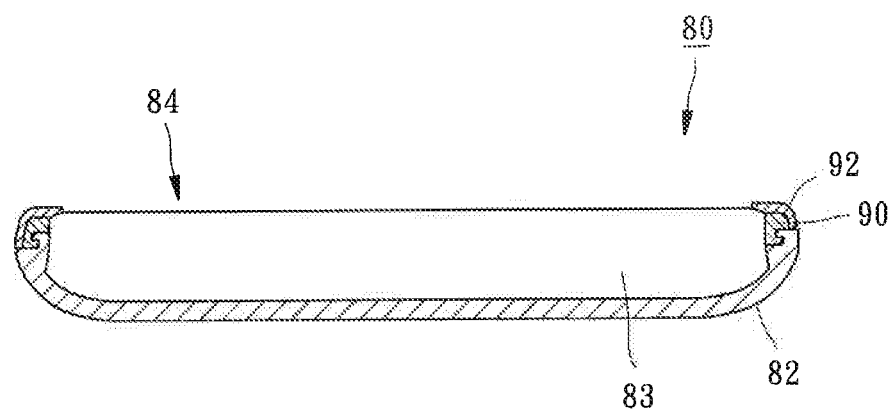
FIG. 17 is similar to FIG. 15 and is a cross-sectional view of the waterproof hermetically-sealed electronic product protection device according to the fourth preferred embodiment of the present invention.

The waterproof hermetically-sealed electronic product protection device of the present invention is applicable to a wide variety of electronic products, such as tablets and smartphones. Referring to FIG. 15, in the fourth preferred embodiment of the present invention, a waterproof hermetically-sealed electronic product protection device 80 is characterized in that a structural change of a body 82 is sufficient to allow a receiving space 83 to fit an electronic product in terms of the external dimensions thereof and thereby allow an engaging portion 86 of a covering element 84 to be fixed to a positioning section 88 of the body 82. Referring to FIG. 16 and FIG. 17, the covering element 84 has a second extension section 90 formed on a first extension section 92 and made of a material different from that of the first extension section 92 to thereby achieve the objective of the present invention.

The constituent elements disclosed in the aforesaid embodiments are illustrative rather than restrictive of the scope of the present invention. Hence, their replacement by any other equivalent elements or changes made thereto should be covered by the claims of the present invention.

What is claimed is:

1. A waterproof hermetically-sealed electronic product protection device, comprising:
    a body having therein a receiving space and at least an opening in communication with the receiving space, the body having a positioning section at a periphery of the at least an opening; and
    at least a covering element having a protective portion and an engaging portion circumferentially disposed at a periphery of the protective portion, the engaging portion being disposed at each said positioning section of the body to thereby allow the at least a covering element to cover the at least an opening of the body, respectively,
    wherein the receiving space of the body is waterproof and hermetically-sealed;
        wherein the positioning section of the body has a loop-shaped hooking portion and a groove;
        wherein the body has a loop-shaped lateral surface adjoining the hooking portion, and the groove is disposed concavely on the lateral surface;
        wherein the engaging portion of the at least a covering element is made of a soft material;
        wherein the engaging portion of the at least a covering element has a loop-shaped first extension section and a second extension section adjoining the first extension section;
        wherein the second extension section is perpendicular to the first extension section;
        wherein a protruding wall is disposed at an end portion of the second extension section;
        wherein the protruding wall extends outwardly from the second extension section to the protective portion;
        wherein the first extension section of the engaging portion and the second extension section of the engaging portion extend along the periphery of the hooking portion;
        wherein the protruding wall is embedded in the groove of the positioning section to bring about a hermetic seal thereto; and
        wherein the first extension section of the engaging portion and the second extension section of the engaging portion each extend along the periphery of and directly contact the hooking portion.

2. The waterproof hermetically-sealed electronic protection device of claim 1, wherein a top surface of the first extension section is higher than or flush with a top surface of the protective portion.

3. The waterproof hermetically-sealed electronic protection device of claim 1, wherein at least a portion of the second extension section is made of a material of higher rigidity than that of the first extension section.

4. The waterproof hermetically-sealed electronic protection device of claim 2, wherein the second extension section is loop-shaped and extends to an inner surface of the first extension section.

5. The waterproof hermetically-sealed electronic protection device of claim 2, wherein the second extension section is defined with hard areas and soft areas spaced apart therefrom, the hard areas being made of a material of higher rigidity than that of the soft areas.

6. The waterproof hermetically-sealed electronic protection device of claim 2, wherein the first extension section of the engaging portion is directly engaged with the hooking portion, and the second extension section encloses an outer edge of the first extension section.

7. The waterproof hermetically-sealed electronic protection device of claim 1, wherein the protective portion and the engaging portion are coupled to each other by adhesion or in-mold injection molding.

8. The waterproof hermetically-sealed electronic protection device of claim 1, wherein an edge of the protective portion extends to enclose the engaging portion completely.

9. The waterproof hermetically-sealed electronic protection device of claim 1, wherein an edge of the protective portion extends to enclose the engaging portion partially.

10. The waterproof hermetically-sealed electronic protection device of claim 1, wherein the at least an opening of the body are in the number of two, and the at least a covering element are in the number of two, the covering elements being disposed at the openings of the body, respectively.

11. The waterproof hermetically-sealed electronic protection device of claim 1, wherein a thickness of the second extension section is larger than a width of the groove.

12. The waterproof hermetically-sealed electronic protection device of claim 2, wherein the second extension section of the engaging portion is superimposed on a bottom surface of the first extension section, wherein the first extension section and the second extension section are disposed at the hooking portion, the first extension section selectively abutting against the hooking portion or abutting against an inner wall surface of the groove to thereby bring about a hermetic seal thereto.

* * * * *